United States Patent [19]

Hamada

[11] Patent Number: 5,371,700
[45] Date of Patent: Dec. 6, 1994

[54] SEMICONDUCTOR MEMORY DEVICE WITH COVERED SIDEWALL SPACERS

[75] Inventor: Kazuyuki Hamada, Tenri, Japan
[73] Assignee: Sharp Kabushiki Kaisha, Osaka, Japan
[21] Appl. No.: 111,876
[22] Filed: Aug. 26, 1993
[30] Foreign Application Priority Data
Oct. 19, 1992 [JP] Japan ................... 4-279646
[51] Int. Cl.⁵ ............................................. G11C 11/24
[52] U.S. Cl. ..................................... 365/149; 257/295
[58] Field of Search ................ 257/295; 365/145, 149
[56] References Cited

U.S. PATENT DOCUMENTS

| | | | |
|---|---|---|---|
| 5,081,559 | 1/1992 | Fazan et al. | 365/145 |
| 5,187,638 | 2/1993 | Sandhu et al. | 257/295 |
| 5,206,788 | 4/1993 | Larson et al. | 257/295 |
| 5,216,572 | 6/1993 | Larson et al. | 257/295 |

FOREIGN PATENT DOCUMENTS 4-14862   1/1992  Japan .
4-82265   3/1992  Japan .
4-356958  12/1992  Japan .

*Primary Examiner*—Eugene R. LaRoche
*Assistant Examiner*—Christopher R. Glembocki
*Attorney, Agent, or Firm*—Nixon & Vanderhye

[57] ABSTRACT

A present invention provides a semiconductor memory device including a capacitor, in which the capacitor comprises an upper electrode, a lower electrode, a ferroelectric capacitor insulating film disposed between the upper electrode and the lower electrode, and a side wall spacer consisting of an insulating material being formed on the side wall of the lower electrode and/or the ferroelectric capacitor insulating film.

6 Claims, 8 Drawing Sheets

5,371,700

SEMICONDUCTOR MEMORY DEVICE WITH COVERED SIDEWALL SPACERS

BACKGROUND OF THE INVENTION

1. Field of the Invention

The invention relates to a semiconductor memory device. More particularly it relates to the semiconductor memory device including a capacitor with a ferroelectric film and having a structure to prevent a leak current.

2. Description of the Related Art

FIG. 8 shows a semiconductor memory device disclosed in IEEE ISSCC 89, p. 242 which uses a ferroelectric film. A cell transistor used in the semiconductor memory device comprises source/drain regions 804a and 804b and a gate electrode 805 formed on a silicon substrate 801 where an active region is defined by forming a device isolation film 802. In this type of semiconductor, a capacitor is disposed through the intermediary of an insulating film on the cell transistor. A lower electrode 809 of the capacitor is formed as a common drive line connecting each memory cells. A ferroelectric film 810 is formed so as to cover the lower electrode 809. Further, an upper electrode 812 is formed on the ferroelectric film 810. Thus, the capacitor is formed on the region having a flat surface, and the cell transistor and capacitor are connected by a local wiring 817 connecting the upper electrode 812 and source/drain region 804b. However, since the local wiring is disposed flatly in this device, it is not effective for reducing the cell size.

In the meanwhile, as shown in FIG. 9, Japanese Unexamined Patent Publication 4-82265 (1992) discloses another semiconductor memory device which utilizes a ferroelectric film without such a local wiring. A cell transistor used in the semiconductor memory device of this type comprises a device isolation film 902, source/drain regions 904a and 904b and a gate electrode 905 formed on a silicon substrate 901. In the device, an interlayer insulating film 906 is formed on the cell transistor, and a lower electrode 909 of the capacitor and capacitor insulating film 910 are directly formed on the source/drain region 904b of the cell transistor by simultaneous patterning. Further, an interlayer insulating film 913 is laminated on the lower electrode 909 and capacitor insulating film 910. A window is formed throughout a part of the interlayer insulating film 913 and the upper electrode 912 is formed thereon. Thus, the capacitor is formed on the region of which surface has step portions. Therefore, the coverage would be deteriorated when the lower electrode 909 is formed by sputtering. In addition, since the lower electrode 909 is directly formed on the substrate 901, in the process of thermal treatment following the formation of the lower electrode 909 and capacitor insulating film 910, elements comprised of the lower electrode 909 and capacitor insulating film 910 are diffused in the source/drain regions 904a and 904b.

In order to solve these problems, a device shown in FIG. 6 has been proposed. The device is manufactured as follows.

First, a silicon substrate 601 having a device isolation film 602 is oxidized followed by forming a gate electrode 603. In use of the gate electrode 603 as a mask, source/drain regions 604a and 604b are formed to form a cell transistor.

After an interlayer insulating film 606 is formed on the cell transistor, a window 607 is opened and a contact plug 608 is embedded therein. Next, a material for a lower electrode of the capacitor and ferroelectric film are deposited on a contact plug 608, and simultaneously patterned in the desired shape to form a capacitor lower electrode 609 and capacitor insulating film 610. Then, a material for an upper electrode is deposited on the lower electrode 609 and insulating film 610, and patterned in the desired shape to form a capacitor upper electrode 612. Next, after depositing an interlayer insulating film 613 on the capacitor, a window 614 is opened so as to extend to a silicon substrate 601 and a wiring 615 is formed by laminating a wiring material. Thus, the semiconductor device is obtained.

However, the semiconductor having the structure described above requires enough marginal spaces A as shown in FIG. 6 when the upper electrode 612 is formed. If the marginal space A is not wide enough, the upper electrode 612 can not be sufficiently etched at step portions, or the upper electrode 612 is adversely formed on the side wall of the capacitor as shown in FIG. 6. These phenomena may cause concentration of an electric field and increase of leak current generated by uneven intensity of the electric field at the edge portion B of the insulating film 610, and may cause to short at the edge portion C of the lower electrode 609. To the contrary, if the marginal space A is too wide, the size of the upper electrode 612 is reduced, whereby large capacity can not be obtained.

Another semiconductor memory device as shown in FIG. 7 has been proposed. In the device, a cell transistor and a contact plug 708 are formed on the silicon substrate 701 by the same method used for the device shown in FIG. 6. A lower electrode 709 is formed on a contact plug 708, and then a ferroelectric film is deposited and etched in use of a mask with enough matching margins which is larger than a lower electrode 709, thereby forming a capacitor insulating film 710 which entirely covers the lower electrode 709. Then, an upper electrode 712 is formed so as to entirely cover the capacitor insulating film 710 on the capacitor insulating film 710 in the same way. In FIG. 7, a reference numeral 702 denotes a device isolation film; 703 denotes a gate electrode; 704a and 704b denote source/drain regions; 705, 706, 713 and 716 denote insulating films; and 715 denotes a wiring.

However, thus formed semiconductor memory device still has a defect of increasing a leak current because of concentration of electric field or uneven intensity of electric field at the edge portion D of the capacitor insulating film 710, or because of reducing a thickness of the capacitor insulating film 710 formed at the edge portion of the lower electrode 709. In addition, grain is readily grown at the interface E between the interlayer insulating film 706 and capacitor insulating film 710 because the crystallinity of the ferroelectric film is poor at the interface, and therefore the leak current is increased through the grain in accordance with an electric field applied to the interface.

SUMMARY OF THE INVENTION

The present invention provides a semiconductor memory device including a capacitor, in which the capacitor comprises an upper electrode, a lower electrode, a ferroelectric capacitor insulating film disposed between the upper electrode and the lower electrode, and a side wall spacer consisting of an insulating material being formed on the side wall of the lower electrode and/or the ferroelectric capacitor insulating film.

DETAILED DESCRIPTION OF THE INVENTION

Figure 1:
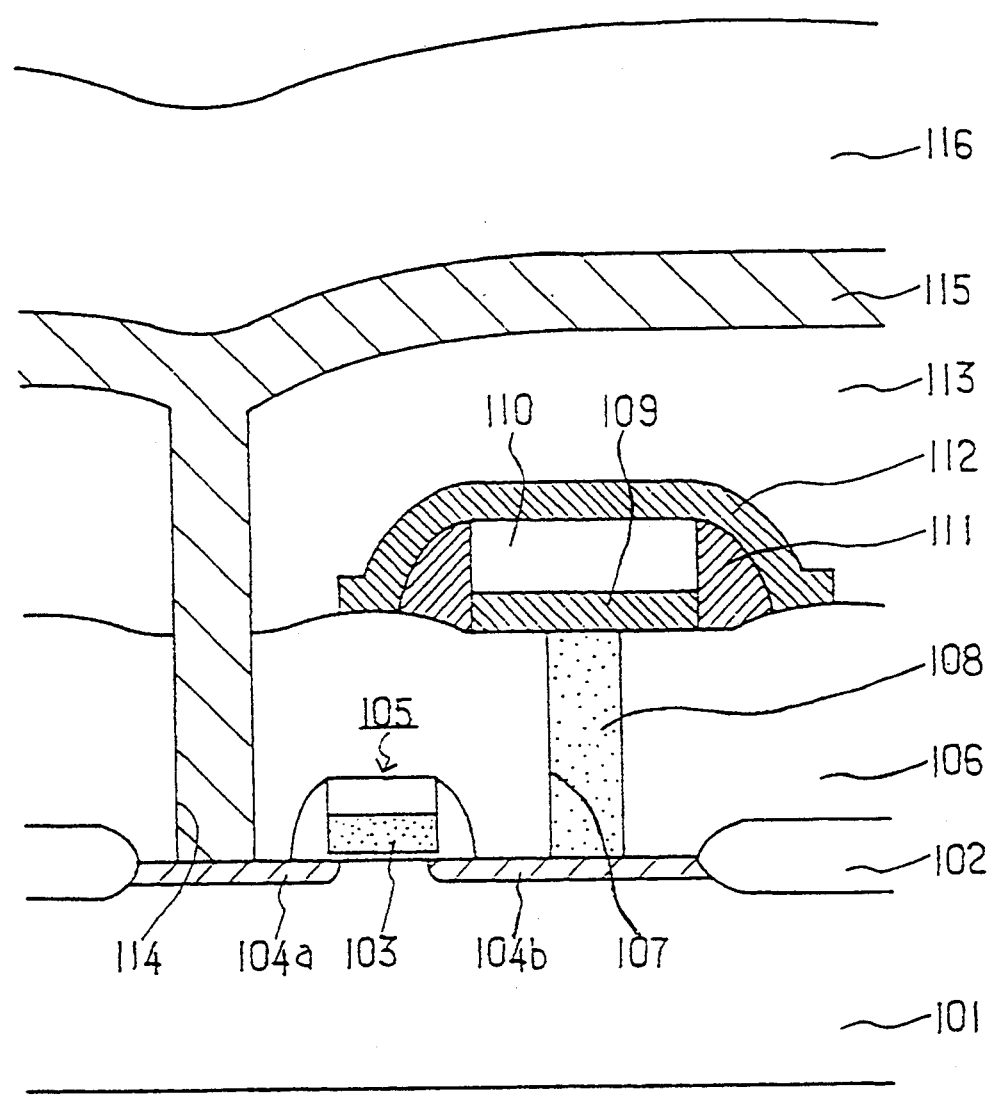
FIG. 1 is a sectional view showing a structure of Example 1 of the present invention.

The semiconductor memory device of this invention includes a plurality of capacitors having a ferroelectric film. The capacitor comprises a upper electrode, a lower electrode, the ferroelectric capacitor insulating film and a side wall spacer formed on the side wall of the lower electrode and/or the ferroelectric capacitor insulating film.

The lower and upper electrodes of the capacitor in the semiconductor memory device of this invention are not limited to any particular material as long as it can be normally used as an electrode. Preferable examples are Pt/Ti, $RuO_2$ and $ReO_3$ which show a good conformity with the ferroelectric materials. More preferable examples are $RuO_2$ and $ReO_3$. A preferable thickness of the lower electrode is 1000 to 3500 angstroms and that of the upper electrode is 500 to 2000 angstroms. The electrode can be formed in accordance with a known method, for example, the sputtering method or the like.

A material having a ferroelectricity such as PLZT may be used as a material for ferroelectric film. The ferroelectric capacitor insulating film can be formed in accordance with a known method, for example, the sputtering method, sol gel method or CVD method. In addition, the ferroelectric capacitor insulating film can be patterned with the photolithography technic, RIE or ion milling method or the like. The thickness of the ferroelectric film is preferred to be 1000 to 5000 angstroms.

As for materials of side wall spacer, $SiO_2$, SiN or $SiO_2$/SiN film may be used. In this case, a material resistant to leak is preferable. As a thickness of the insulating film may be the same thickness as that of the lower electrode or the ferroelectric capacitor insulating film, preferably 1000 to 6000 angstroms.

The lower electrode and ferroelectric capacitor insulating film are preferably formed such that the side wall spacer can be fixed thereon with or without a little inclination from the vertical direction to the lower insulating film, more preferably such that the side wall spacer can be fixed thereon in vertical to the lower insulating film. It is preferable to use a flattened insulating film or an insulating film with reflowing property for the insulating films where the side wall spacer is provided.

Further, the upper electrode is preferably formed so as not to be directly contacted with the lower electrode. For example, the upper electrode may be formed such that the end portion therefor is formed on the side wall spacer deposited on the side wall of the lower electrode and/or ferroelectric capacitor insulating film. Alternatively, the upper electrode may be formed to cover the lower electrode or ferroelectric capacitor insulating film, or to cover the lower electrode and/or the whole side wall spacer deposited on the side wall of the ferroelectric capacitor insulating film.

The materials for the plug and wiring of the semiconductor device of the present invention may be conventional materials for plug and wiring, and are not particularly limited.

Incidentally, in the semiconductor memory device of the present invention, the upper or lower electrode can be a common electrode of each cell and the structure of the semiconductor memory device is not limited to the device illustrated in the examples described below.

The present invention is illustrated with reference to FIGS. 1 to 5 in detail as follows.

EXAMPLE 1

FIG. 1 is a cross section of a semiconductor memory device of Example 1 of the present invention. The semiconductor memory device of this example is manufactured as follows.

First, a field oxide film 102 for device isolation is formed on a P-type silicon substrate 101, then the silicon substrate 101 is oxidized and a gate electrode 103 and an insulating film are deposited thereon. The gate electrode 103 is patterned by photoetching and N-type source/drain regions 104a and 104b are formed by implanting ions. An insulating film is further deposited thereon followed by etching back by the RIE method, thereby obtaining a cell transistor 105.

Subsequently, an insulating film 106 is deposited and a contact hole 107 is foraged throughout the insulating film by photoetching. Then, N-type polysilicon is deposited to be embedded therein, followed by etching back to form a plug 108 in the contact hole 107.

After depositing Pt/Ti (upper layer/lower layer) as material for a power electrode 109 with 1500/300 angstroms in thickness on the plug 108, PZT is deposited by sputtering to form a ferroelectric film 110 with 3000 angstroms in thickness. Subsequently, the above ferroelectric film PZT and materials of lower electrode Pt/Ti are patterned simultaneously by photoetching in use of a prescribed mask and by dry etching such as RIE method or ion milling, thereby forming a lower electrode 109 and ferroelectric film 110.

Next, a side wall spacer 111 is formed on the side wall of the lower electrode 109 and ferroelectric film 110 by depositing an $SiO_2$ film with 3300 angstroms in thickness by the CVD method, followed by etching back by the RIE method. Then, Pt is deposited with 1500 angstroms in thickness as a material for an upper electrode, followed by photoetching the material to form an upper electrode 112 covering the lower electrode 109, the ferroelectric film 110 and side wall spacer 111. Thus, a capacitor comprising the lower electrode 109, ferroelectric film 110, side wall spacer 111 and upper electrode 112, is formed.

After depositing an insulating film 113 on the capacitor, a contact hole 114 is formed throughout the insulating films 113 and 106 to a source/drain region 104a by photoetching, and then aluminum is deposited as a material for wiring and photoetched to form a wiring 115. Finally, an insulating film 116 such as SiO$_2$ and SiN is deposited thereon, thereby obtaining the semiconductor memory device of Example 1 of the present invention.

EXAMPLE 2

Figure 2:
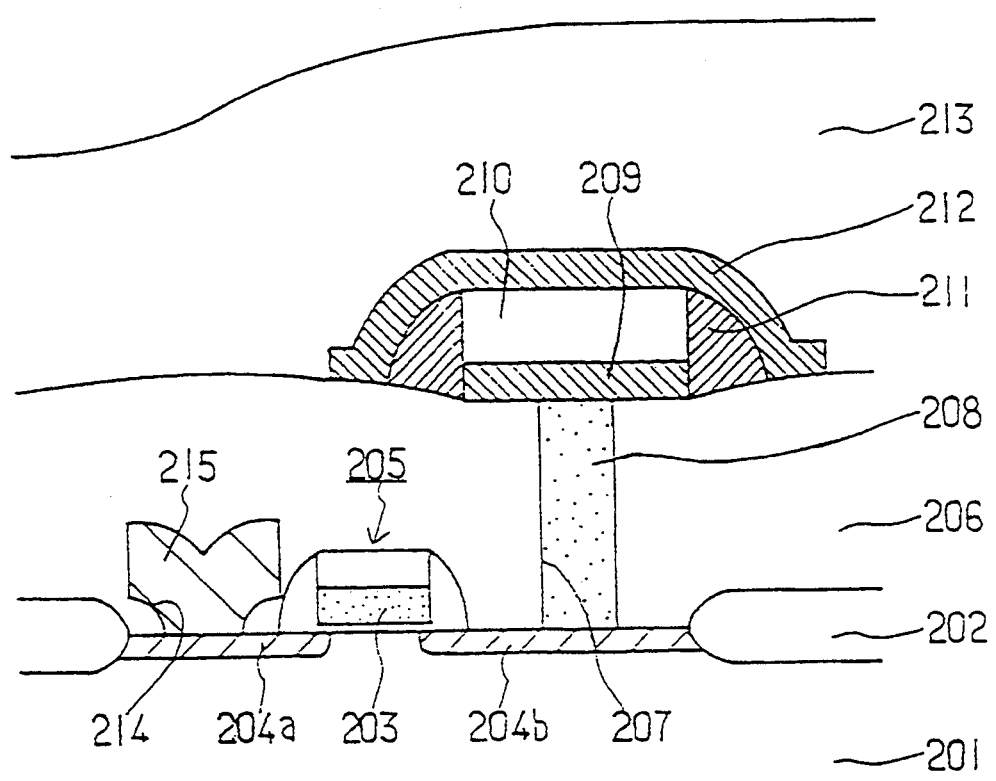
FIG. 2 is a sectional view showing a structure of Example 2 of the present invention.

FIG. 2 shows a cross section of a semiconductor memory device of Example 2 in which a wiring 215 is formed between a capacitor and cell transistor in the semiconductor memory device of Example 1. The semiconductor memory device of Example 2 is manufactured as follows.

Similar to Example 1, a cell transistor comprising a field oxidation film 202 for device isolation, a gate electrode 203 and source/drain regions 204a and 204b, is formed on a P-type silicon substrate 201.

Subsequently, after depositing an insulating film (not shown), a contact hole 214 is formed throughout the insulating film to a source/drain region 204a by photoetching, and then a wiring 215 is formed by depositing a material such as silicide in the contact hole 214 followed by photoetching.

In the same manner described in Example 1, after the formation of an insulating film 206, a contact hole 207 and a plug 208, a capacitor which comprises the lower electrode 209, ferroelectric film 210, side wall spacer 211 and upper electrode 212 is formed, and an insulating film 213 is further deposited thereon.

EXAMPLE 3

Figure 3:
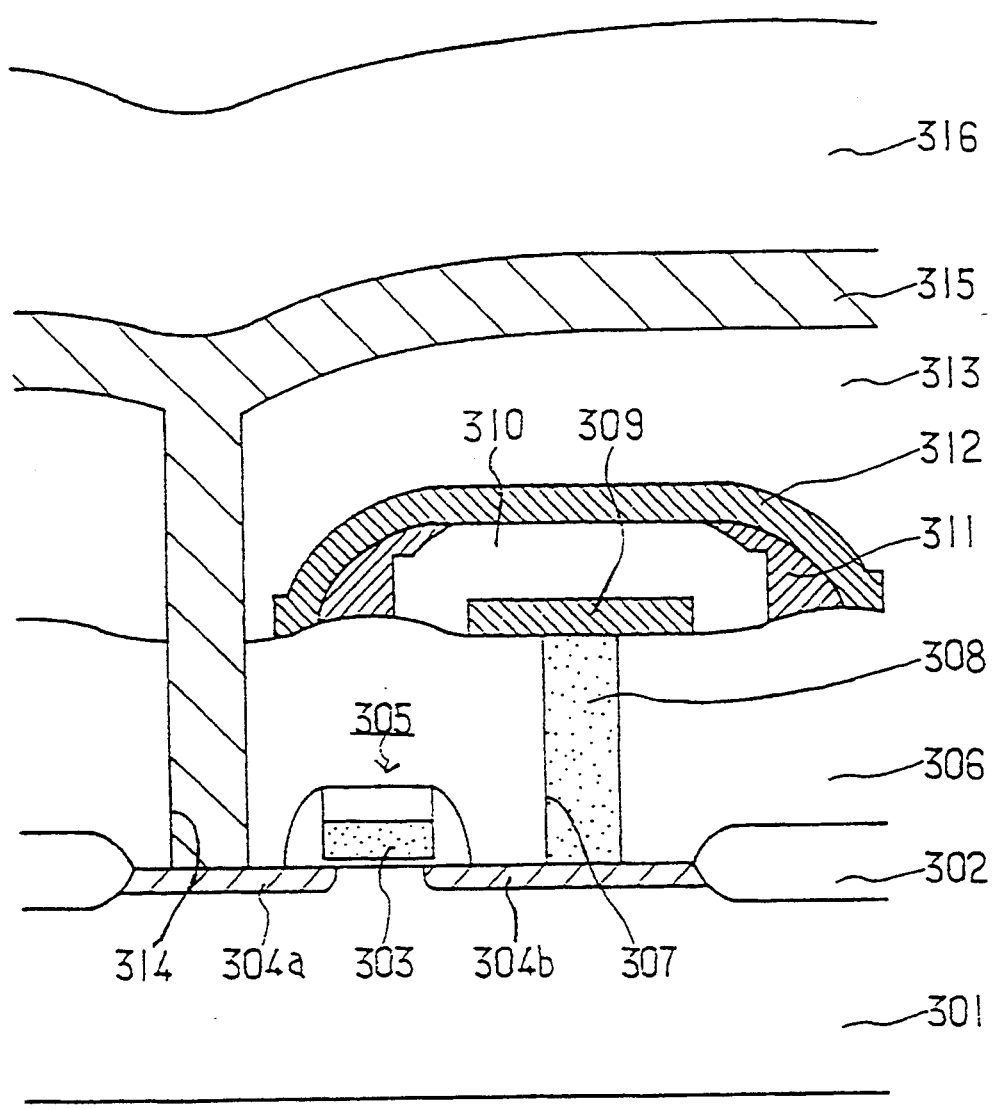
FIG. 3 is a sectional view showing a structure of Example 3 of the present invention.

FIG. 3 shows a cross section of a semiconductor memory device of Example 3. This example is different from Example 1 in the manufacturing processes of the capacitor and its structure. The semiconductor memory device of this example is manufactured as follows.

Similar to Example 1, a cell transistor 305 which comprises a field oxidation film 302 for device isolation, a gate electrode 303 and source/drain regions 304a and 304b; an insulating film 306; a contact hole 307; and a plug 308 are formed on a P-type silicon substrate 301.

Subsequently, a lower electrode 309 is formed by depositing Pt/Ti (upper layer/lower layer) with 1500/300 angstroms in thickness as a lower electrode 309 material on the plug 308 followed by photoetching. Then, PZT is deposited as a ferroelectric film 310 by sputtering with 3000 angstroms in thickness and patterned by photoetching in use of a mask which covers the lower electrode 309, thereby forming a ferroelectric film 310.

Then, an SiO$_2$ film is deposited with 3300 angstroms in thickness by the CVD method and etched back by the RIE method to form a side wall spacer 311 on the side wall of the ferroelectric film 310. An upper electrode 312 is then formed by depositing Pt as a material for an upper electrode with 1500 angstroms in thickness and etching to cover the ferroelectric film 310 and the side wall spacer 311. Thus, a capacitor comprising the lower electrode 309, ferroelectric film 310, side wall spacer 311 and upper electrode 312, is formed.

Then, an insulating film 313, a contact hole 314, a wiring 315 and an insulating film 316 are formed in the same manner described in Example 1.

EXAMPLE 4

Figure 4:
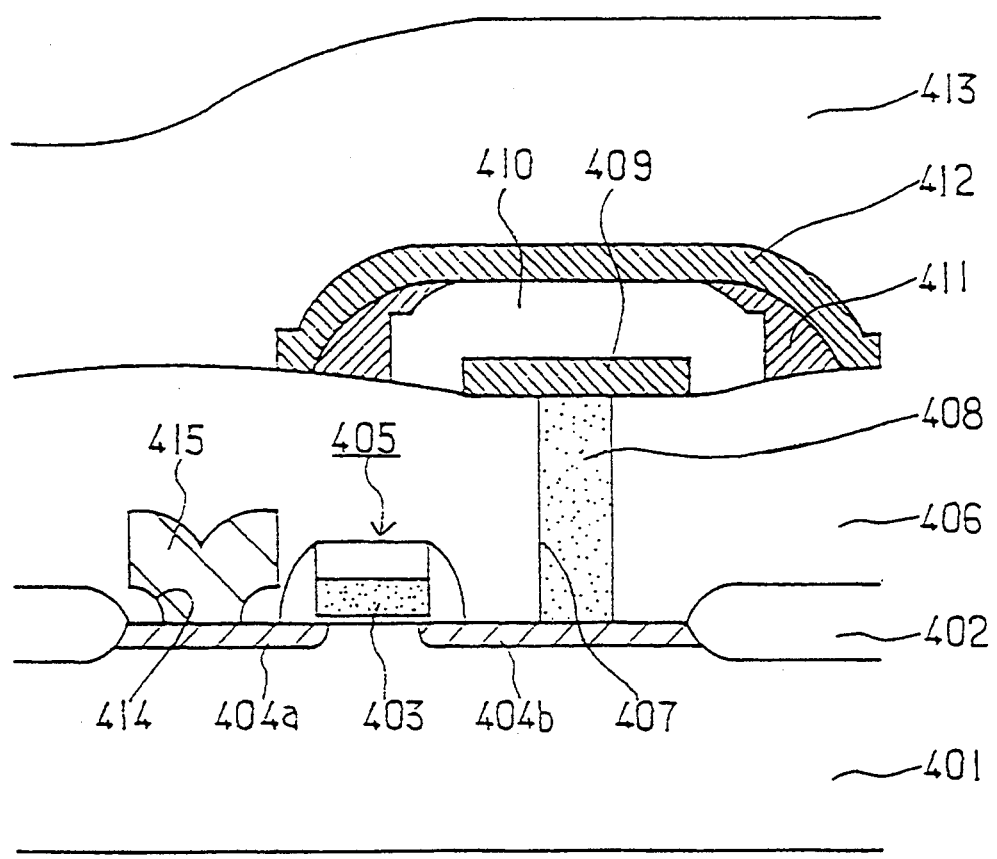
FIG. 4 is a sectional view showing a structure of Example 4 of the present invention.

FIG. 4 shows a cross section of a semiconductor memory device of Example 4 in which a wiring is formed between a capacitor and cell transistor in the semiconductor memory device of Example 3. The semiconductor memory device of this example is manufactured as follows.

Similar to Example 1, a cell transistor 405 comprising a field oxidation film 402 for device isolation, a gate electrode 403 and source/drain regions 404a and 404b, is formed on a P-type silicon substrate 401.

Subsequently, after depositing an insulating film (not shown), a contact hole 414 is formed throughout the insulating film to a source/drain region 404a by photoetching and a wiring 415 is formed by depositing wiring materials such as silicide in the contact hole 414 followed by photoetching.

Next, a lower electrode 409, ferroelectric film 410, side wall spacer 411 consisting of insulating materials and upper electrode 412 are formed in the same manner described in Example 3 to foden a capacitor. Then, an insulating film 406, a contact hole 407 and a plug 408 are formed in the same manner described in Example 3.

EXAMPLE 5

Figure 5:
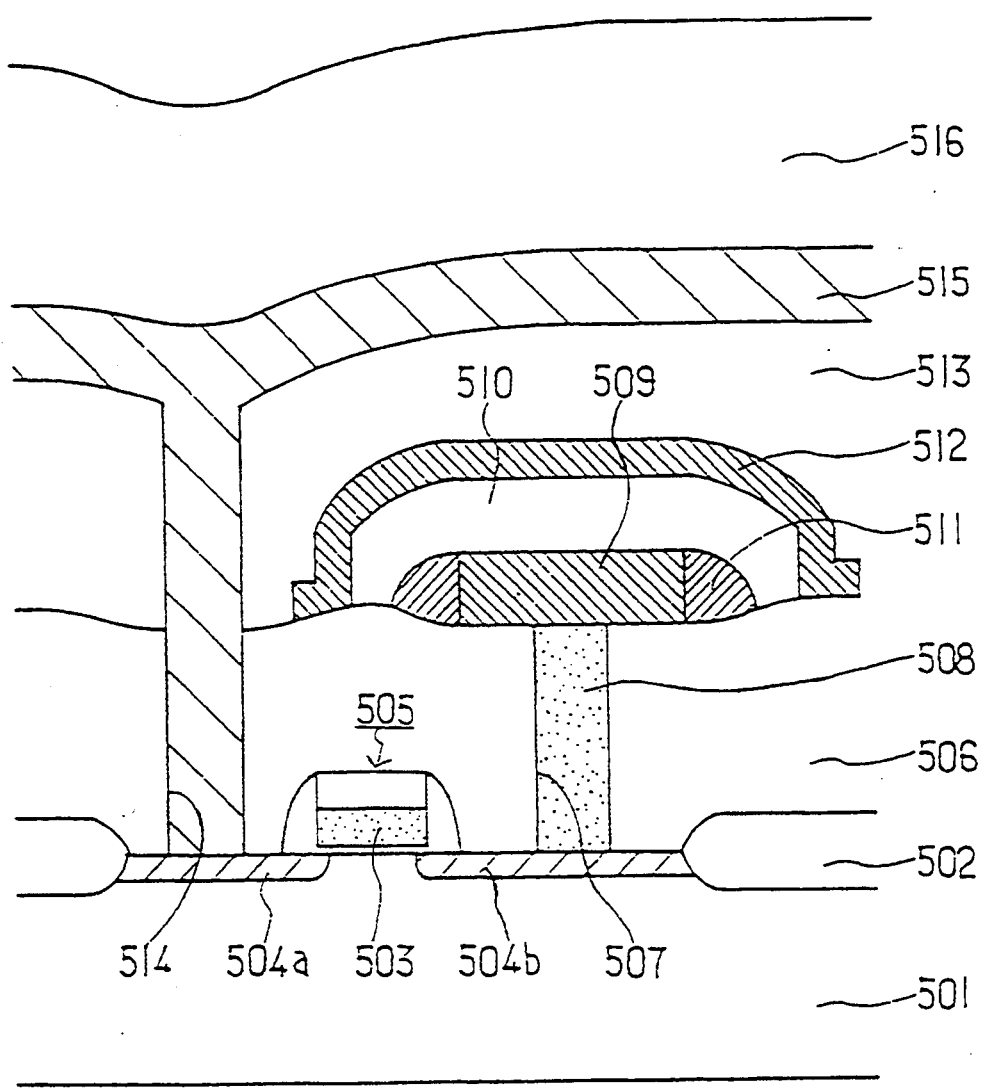
FIG. 5 is a sectional view showing a structure of Example 5 of the present invention.
Figure 6:
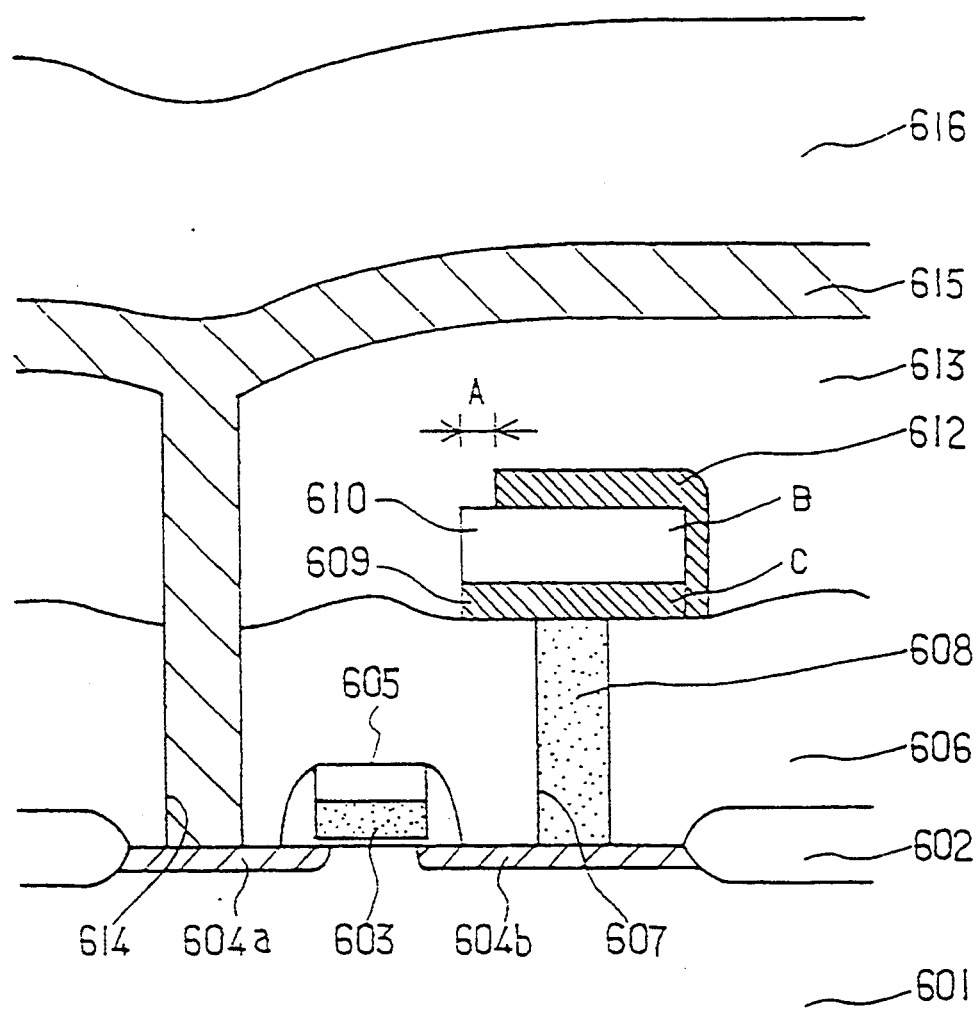
FIG. 6 is a sectional view showing a structure of a conventional semiconductor memory device.
Figure 7:
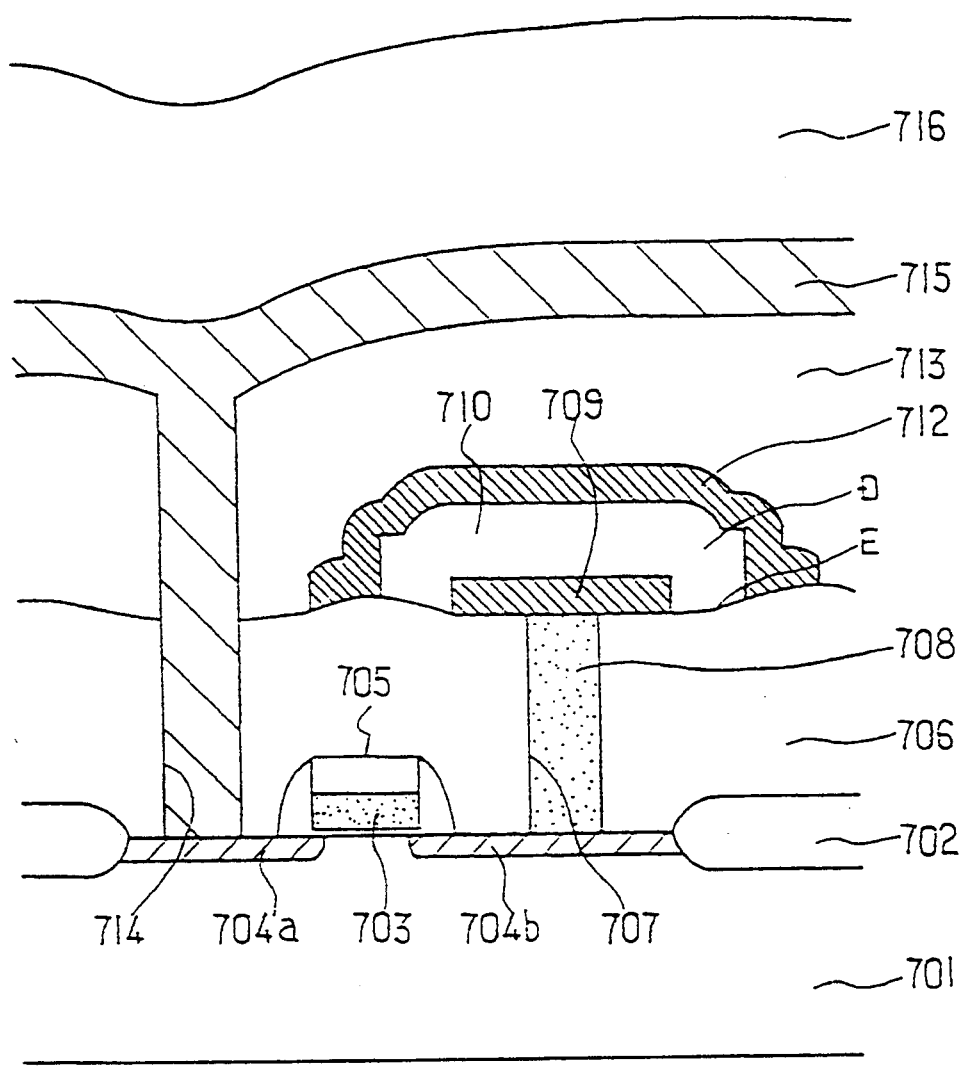
FIG. 7 is a sectional view showing a structure of another conventional semiconductor memory device.
Figure 8:
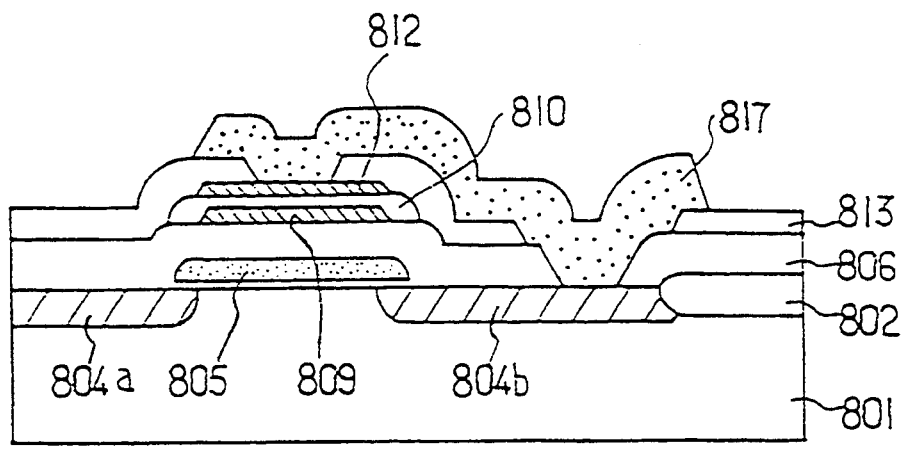
FIG. 8 is a sectional view showing a structure of still another conventional semiconductor memory device.
Figure 9:
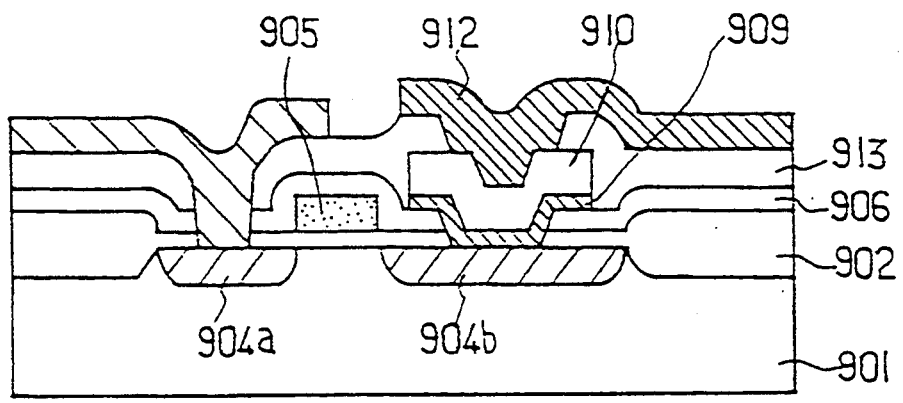
FIG. 9 is a sectional view showing a structure of still another conventional semiconductor memory device.

FIG. 5 shows a cross section of Example 5 of the present invention. This example is different from Example 1 in the manufacturing processes for the capacitor and in its structure. A semiconductor memory device of this example is manufactured as follows.

Similar to Example 1, a cell transistor 505 which comprises a field oxidation film 502 for device isolation, a gate electrode 503 and source/drain regions 504a and 504b; an insulating film 506; a contact hole 507; and a plug 508 are formed on a P-type silicon substrate 501.

Subsequently, a lower electrode 509 is formed by depositing Pt/Ti (upper layer/lower layer) with 3000/300 angstroms in thickness as lower electrode materials and by photoetching. Then, a side wall spacer 511 is formed on the side wall of the lower electrode 509 by depositing an SiO$_2$ film with 3300 angstroms in thickness by CVD and etching back using the RIE method.

Next, PZT is deposited on the lower electrode 509 and the side wall spacer 511 as a material for ferroelectric film by sputtering with 3000 angstroms in thickness, and patterned by photoetching in use of a mask which covers the lower electrode 509 and by dry etching such as RIE method, thereby forming a ferroelectric film 510.

An upper electrode 512 is formed thereon by depositing Pt as a material for an upper electrode with 1500 angstroms in thickness so as to cover the ferroelectric film 510. Thus, a capacitor comprising the lower electrode 509, ferroelectric film 510, side wall spacer 511 consisting of an insulating material and upper electrode 512, is formed. Then, an insulating film 513, a contact hole 514, a wiring 515 and an insulating film 516 are formed in the same manner described in Example 1.

Thus, according to the present invention, the leak current occurred between the electrodes can be controlled while the capacity of the capacitor can be retained. Therefore, the semiconductor memory device having a ferroelectric capacitor can be obtained with high quality and reliability. Moreover, the processing of the semiconductor memory device is simplified, thereby improving a production yield.

What we claim is:

1. A semiconductor memory device including a capacitor, in which the capacitor comprises
   an upper electrode, a lower electrode, a ferroelectric capacitor insulating film disposed between the upper electrode and the lower electrode, said insulating film being completely covered by the upper electrode, and a side wall spacer consisting of an insulating material being formed on the side wall of the lower electrode or the ferroelectric capacitor insulating film and said side wall spacer being completely covered by the upper electrode.

2. The semiconductor memory device according to claim 1, the side wall spacer is deposited on the side wall of the lower electrode and the ferroelectric capacitor insulating film.

3. The semiconductor memory device according to claim 1, the side wall spacer is deposited on the side wall of the lower electrode.

4. The semiconductor memory device according to claim 1, the side wall spacer is deposited on the side of the ferroelectric capacitor insulating film.

5. The semiconductor memory device according to claim 1, the side wall spacer is covered with the upper electrode.

6. A semiconductor memory device including a capacitor, in which the capacitor comprises an upper electrode, a lower electrode, a ferroelectric capacitor insulating film disposed between the upper electrode and the lower electrode, and a side wall spacer consisting of an insulating material being formed on the side wall of the lower electrode or the ferroelectric capacitor insulating film, wherein the side wall spacer is covered with the ferroelectric capacitor insulating film.

* * * * *